US010454488B1

(12) United States Patent
Monangi

(10) Patent No.: US 10,454,488 B1
(45) Date of Patent: Oct. 22, 2019

(54) VARIABLE SPEED COMPARATOR

(71) Applicant: Analog Devices Global Unlimited Company, Hamilton (BM)

(72) Inventor: Sandeep Monangi, Srikakulam (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/994,112

(22) Filed: May 31, 2018

(51) Int. Cl.
*H03M 1/10* (2006.01)
*H03M 1/12* (2006.01)
*H03F 3/45* (2006.01)
*H03K 5/24* (2006.01)

(52) U.S. Cl.
CPC ...... *H03M 1/1014* (2013.01); *H03F 3/45076* (2013.01); *H03K 5/2472* (2013.01); *H03M 1/124* (2013.01); *H03M 1/1205* (2013.01)

(58) Field of Classification Search
CPC .. H03M 1/124; H03M 1/1205; H03M 1/1014; H03K 5/2472; H03F 3/45076
USPC .................................................. 341/150–160
See application file for complete search history.

(56) References Cited

U.S. PATENT DOCUMENTS

| 4,419,692 A * | 12/1983 | Modisette | H04N 3/09 250/332 |
| 4,556,866 A * | 12/1985 | Gorecki | H04B 3/542 329/300 |
| 4,962,323 A * | 10/1990 | Ta | H03F 3/45753 327/362 |
| 5,093,664 A * | 3/1992 | Senn | H03M 1/147 341/156 |
| 5,140,326 A * | 8/1992 | Bacrania | H03K 3/35625 341/158 |
| 5,191,332 A * | 3/1993 | Shieu | H03M 3/39 341/143 |

(Continued)

OTHER PUBLICATIONS

Harpe, Pieter J, et al., "A 26 W 8 bit 10 MS/s Asynchronous SAR ADC for Low Energy Radios", IEEE Journal of Solid-State Circuits, vol. 46, No. 7, Jul. 2011, (Jul. 7, 2011), 1585-1595.

(Continued)

*Primary Examiner* — Lam T Mai
(74) *Attorney, Agent, or Firm* — Schwegman Lundberg & Woessner, P.A.

(57) ABSTRACT

Various examples are directed to a variable speed comparator circuit comprising a first comparator, a second comparator, and a third comparator and a logic circuit. The first comparator may be configured to generate a first comparator output using a first input and a second input. The second comparator may be configured to generate a second comparator output using the first input and the second input. The third comparator may be configured to generate a third comparator output using the first input and the second input. A propagation delay of the second comparator may be less than a propagation delay of the first comparator. Also, a propagation delay of the third comparator may be less than the propagation delay of the second comparator. The second comparator may have an input offset relative to the third comparator. The logic circuit may be configured to determine that the second comparator output and the third comparator output are not equivalent and set a comparator circuit output to the first comparator output.

20 Claims, 8 Drawing Sheets

(56) References Cited

U.S. PATENT DOCUMENTS

| | | | | |
|---|---|---|---|---|
| 5,262,779 A | * | 11/1993 | Sauer | H03K 5/2481 |
| | | | | 327/362 |
| 5,272,481 A | * | 12/1993 | Sauer | H03M 1/0602 |
| | | | | 327/63 |
| 5,397,936 A | * | 3/1995 | Wang | H03K 5/249 |
| | | | | 327/307 |
| 6,084,538 A | * | 7/2000 | Kostelnik | H03K 5/2481 |
| | | | | 341/118 |
| 6,617,918 B2 | * | 9/2003 | Casper | H03F 3/45183 |
| | | | | 327/124 |
| 6,653,893 B2 | * | 11/2003 | Casper | H03F 3/45183 |
| | | | | 330/252 |
| 6,667,707 B2 | | 12/2003 | Mueck et al. | |
| 7,701,256 B2 | | 4/2010 | Hurrell et al. | |
| 8,525,710 B1 | * | 9/2013 | Tsang | H03M 1/0607 |
| | | | | 341/118 |

OTHER PUBLICATIONS

Roh, Jeongjin, et al., "A 0.9-V 60-W 1-Bit Fourth-Order Delta-Sigma Modulator With 83-dB Dynamic Rang", IEEE Journal of Solid-State Circuits, vol. 43, No. 2, Feb. 2008, (Feb. 2, 2008), 361-370.

* cited by examiner

VARIABLE SPEED COMPARATOR

FIELD OF THE DISCLOSURE

This document pertains generally, but not by way of limitation, to integrated circuits and, and particularly, but not by way of limitation, to comparator circuits.

BACKGROUND

A comparator circuit compares two input signals to generate an output signal. If a first input is higher than a second input (e.g., a higher voltage, a higher current, etc.), then the output of the comparator assumes a first logic value. If the second input is higher than the first input, then the output of the comparator assumes a second logic value.

SUMMARY OF THE DISCLOSURE

Various examples described herein are directed to a variable speed comparator circuit. The variable speed comparator circuit comprises a first comparator, a second comparator, and a third comparator. The first, second, and third comparators are connected to receive a first input and a second input. Generally, the first comparator is slower and more accurate than the second and third comparators. For example, the first comparator may have a longer propagation delay than the second and third comparators. The second and third comparators are arranged with input offset relative to one another. For example, if the difference between the first and second inputs is large (e.g., larger than the relative input offset of the second and third comparators), then the respective outputs of the second and third comparators will be equivalent. On the other hand, if the difference between the first and second inputs is small (e.g., smaller than the relative input offset of the 25 second and third comparators), then the respective outputs of the second and third comparators will not be equivalent.

A logic circuit determines whether the outputs of the second and third comparator are equivalent. If the second and third comparator outputs are equivalent, the logic circuit sets the output of the variable speed comparator circuit to the common logic value of the second and third comparator output. If the second and third comparator outputs are not equivalent, then the logic circuit sets the output of the variable speed comparator circuit to the output of the first comparator.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
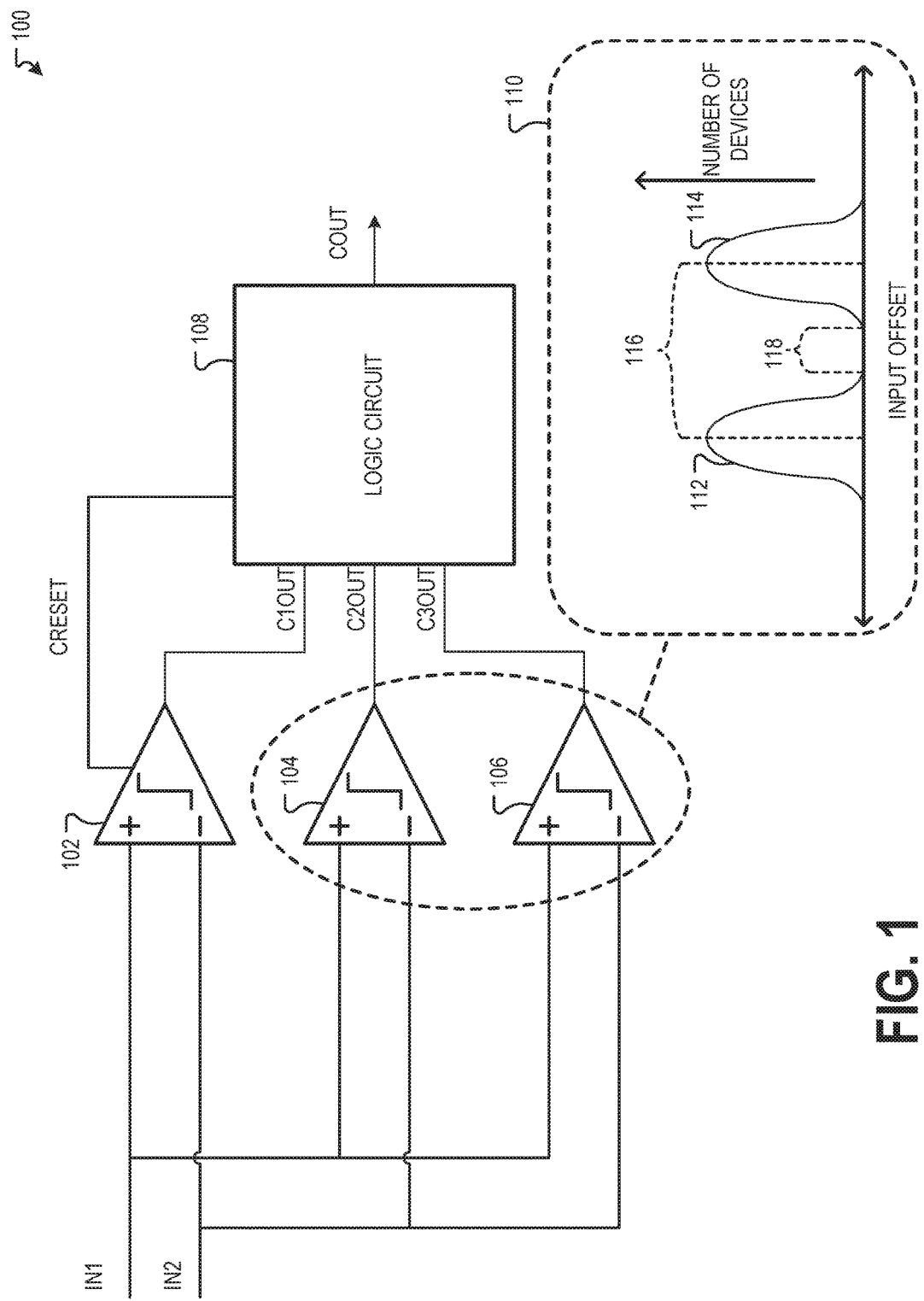
FIG. 1 is a diagram showing one example of a comparator circuit.

Comparators are used in many different applications including, for example, in ADCs, such as SAR ADCs, flash ADCs, etc. Comparators typically balance speed and accuracy. The speed of a comparator describes how fast the comparator generates an output. Comparator speed is also related to propagation delay, which is an indication of how long it takes the comparator to generate an output. Faster comparators have lower propagation delays than slower comparators.

The accuracy of a comparator describes the smallest input difference that can be resolved by the comparator. For example, when the difference between comparator inputs is small, a more accurate comparator is more likely to generate the correct output than a less accurate comparator.

It can be challenging to make comparators both fast and accurate. For example, one way to improve the accuracy of a comparator is to introduce gain. This may be done by adding one or more gain stages to the comparator, sometimes a cascade of multiple gain stages. Another way to improve the accuracy of a comparator is to cancel offset and using, for example, auto-zeroing as described herein. Features such as gain stages and auto-zeroing, however, can increase the propagation delay of a comparator.

The various example comparator circuits described herein balance speed and accuracy based on the difference between the first and second inputs. For example, if the difference between the first and second inputs is large, (e.g., larger than the relative input offset of the second and third comparators), then fine accuracy may not be as important to determine a correct comparator circuit output and speed may be more desirable. In this case, the comparator circuit may generate a comparator circuit output based on the outputs of the faster second and third comparators. On the other hand, if the difference between the first input and the second input is small, fine accuracy may be more desirable than speed. Accordingly, the comparator circuit may generate a comparator circuit output based on the output of the slower first comparator.

Although the comparator circuit described herein may be used in many different contexts, in some examples, it is used with an SAR ADC. A SAR ADC finds the digital equivalent of an analog input signal by performing a series of bit trials. In a bit trial, a SAR register and/or associated logic generates a digital test code. A digital-to-analog converter (DAC) generates an analog-converted version of the test code. A comparator compares the analog-converted test code to the analog ADC input. The SAR generates the next test code based on the results of the comparison. Because the SAR ADC performs multiple bit trials for each conversion, it is desirable for the comparator to operate quickly. Similarly, the accuracy of the SAR ADC depends on the accuracy of the comparator. For example, a comparator error can lead to an incorrect ADC output.

In a SAR ADC, some bit trials will use test codes that are considerably different from the ADC input. For these bit trials, a fast but less accurate comparator may suffice. In other bit trials, however, the test codes are closer to the ADC input. Accordingly, a relatively inaccurate comparator is more likely to return an incorrect result. For this second category of bit trial, a more accurate comparator may be advantageous, even if the comparison takes longer.

With a SAR ADC, it is challenging to predict which bit trials are best performed with a fast but less accurate comparator and which bit trials would benefit from a higher-accuracy comparator, even at the expense of less speed. For the final bit trial that sets the least significant bit (LSB) of the ADC output may use a test code that is close to the ADC input, making high accuracy desirable. At least one other bit trial may use a test code that is close to the ADC input, but it is difficult to predict which bit trial or trials that is. The comparator circuit described herein may address this difficulty. For example, when the comparator circuit described herein is used in a SAR ADC, it may quickly generate an output when the test code and ADC input are far enough apart though that the second and third comparators provide equivalent outputs. When the test code and ADC input are close enough in value that the second and third comparators generate different outputs, the comparator circuit may provide a comparator output based on the output of the first comparator having a longer-propagation delay but more accuracy. Although various examples herein describe the comparator circuit in the context of a SAR ADC, comparators arranged as described herein may be used in various different applications including other ADCs, other types of circuits, etc.

FIG. 1 is a diagram showing one example of a comparator circuit 100. The comparator circuit 100 comprises three comparators 102, 104, 106, and a logic circuit 108. The comparator circuit 100 receives a first input IN1 and a second input IN2 and generates an output COUT. The output COUT reflects the relationship between the first input IN1 and the second input IN2. If the first input IN1 is greater than the second input IN2, then the output COUT has a first logic value. If the second input IN2 is greater than the first input IN1, then the output has a second logic value. In the example of FIG. 1, the first input IN1 is provided to non-inverting inputs of the comparators 102, 104, 106 and the second input IN2 is provided to inverting inputs of the comparators 102, 104, 106. Accordingly, the logic value of the output COUT is "1" or "true" if the first input IN1 is greater than the second input IN2 and "0" or "false" if the second input IN2 is greater than the first input IN1.

The comparator circuit 100 may be a voltage comparator or a current comparator. When the comparator circuit 100 is a voltage comparator, the logic state of the output COUT indicates which input IN1, IN2 has a higher voltage. When the comparator circuit 100 is a current comparator, the logic state of the output COUT indicates which input IN1, IN2 has a higher current. Also, the logic state of the output COUT may be indicated in any suitable manner. For example, a logic "1" or "true" may correspond to a particular voltage, current, range of voltages, range of currents, etc. Similarly, a logic "0" or "false" may correspond to a particular voltage, current, range of voltages, range of currents, etc.

The comparator 102 is electrically coupled to receive the first input IN1 and the second input IN2 and generate a first comparator output C1OUT that reflects the relationship between the inputs IN1, IN2. The comparator 102 has an accuracy that is relatively higher than the accuracy of the comparators 104, 106. For example, the comparator 102 may have a smaller input offset than the comparators 104, 106. The comparator 102, in some examples, is also slower than the comparators 104, 106. For example, the comparator 102 may have a propagation delay longer than the propagation delays of the comparators 104, 106.

In some examples, the comparator 102 comprises one or more preamplifier stages followed by a latch. The one or more preamplifier stages amplify a difference between the first input signal IN1 and the second input signal IN2. The latch assumes a logic value (e.g., 1 or 0) based on the relationship between the amplified input signals. The preamplifier stages may increase the accuracy of the comparator 102, for example, by amplifying the difference between the input signals IN1, IN2, but may also increase the propagation delay of the comparator 102, thereby reducing its speed. In some examples, the comparator 102 may also be configured with auto-zeroing, as described herein. A comparator with auto-zeroing may be referred to as an auto-zero comparator.

The comparators 104, 106 may be faster than the comparator 102 (e.g., have lower propagation delays), but may also be less accurate than the comparator 102. That is, the comparators 104, 106 may be more likely than the comparator 102 to generate respective outputs C2OUT, C3OUT that do not accurately reflect the relationship between the first input IN1 and the second input IN2. For example, the comparators 104, 106 may have a higher input offset than the comparator 102.

The design of the comparators 104, 106 differs from the design of the comparator 102 in a manner that causes the propagation delay of the comparators 104, 106 to be less than the propagation delay of the comparator 102. Design differences between the comparator 102 and the comparators 104, 106 may also cause the accuracy of the comparator 102 to be greater than the accuracy of the comparators 104, 106. For example, the comparators 104, 106 may include no preamplifier stages and/or fewer preamplifier stages than the comparator 102. (In some examples, the comparators 104, 106 include a latch with no preamplifier stages.) Having fewer preamplifier stages may increase the speed of the comparators 104, 106 by reducing the number of stages in the device, but may also reduce the accuracy of the comparators 104, 106. Also, in some examples, the comparator 102 includes auto-zeroing circuitry (See the example of FIG. 5) while comparators 104, 106 may not. Also, in some examples, the comparator 102 may be made with higher quality, better-matched components than the comparators 104, 106. In some examples, comparators 104,106 may be clocked at faster rate compared to comparator 102.

Comparators 104, 106 are arranged with an input offset relative to one another. This means that the outputs C2OUT, C3OUT may not have equivalent logic states unless the inputs IN1, IN2 are different by more than a threshold amount (e.g., by more than the relative input offset). The input offset of a comparator is a difference between the inputs to the comparator that causes the output of the comparator to change logic states. Consider an example comparator having a positive input offset. In this example, the output of the comparator has a logic value of "0" or "false" if the non-inverting input is greater than the inverting input by less than the input offset. Similarly, an example comparator having a negative input offset generates an output having a logic value of "1" or "true" if the inverting input is greater than the non-inverting input by less than the input offset.

Comparators 104, 106 may have an input offset relative to one another. For example, the input offset the comparator 104 is different than the input offset of the comparator 106 such that the outputs C2OUT, C3OUT have equivalent logic values when the difference between the input signals IN1, IN2 is greater than the difference between the input offsets of the comparators 104, 106. In some examples, one comparator 104, 106 has an input offset while the other comparator 104, 106 does not. Also, in some examples, both comparators 104, 106 have input offsets and the relative input offset is a difference between the respective input offsets. In some examples, one comparator 104, 106 has a positive input offset while the other comparator 104, 106 has a negative input offset.

The input offset for a comparator may differ due to variations in device fabrication. For example, the input offset for a comparator of a particular design may be described by a distribution, such as a Gaussian distribution. Plot 110 illustrates input offset distributions 112, 114. The comparator 104 may be selected from comparators having the distribution 112 of input offsets while the comparator 106 may be selected from comparators having the distribution 114 of input offsets. The difference 116 in the means of the distributions 112, 114 indicates the difference in input offset between the mean example of the comparator 104 and the mean example of the comparator 106. Also, in some examples, the distributions 112, 114 may be selected such that they are separated by a minimum difference 118 up to a threshold level. In some examples, the minimum difference 118 is between comparators 104, 106 that deviate from the respective means by one standard deviation, two standard deviations, three standard deviations, or any other suitable value.

The distributions 112, 114 are shown on an input offset axis that indicates input offset. The zero point of the input offset axis is not shown in FIG. 1 to indicate that the input offsets of comparators 104, 106 can be positive, negative, and/or centered on zero. In some examples, the mean of the distribution 112 is at or about zero and the mean of the distribution 114 is positive. Also, in some examples, the mean of the distribution 114 is at zero and the mean of the distribution 112 is negative. In some examples, the means of the distributions 112, 114 are both positive, or both negative.

The logic circuit 108 receives the outputs C1OUT, C2OUT, C3OUT of the comparators 102, 104, 106 and generates the output COUT of the comparator circuit. If the outputs C2OUT, C3OUT have equivalent logic values, the logic circuit 108 sets the output COUT equal to the common logic value of C2OUT and C3OUT. If this outputs C2OUT, C3OUT do not have equivalent logic values, the logic circuit 108 sets the output COUT equal to the output C OUT of the comparator 102.

Recall that, because of the difference in input offset between the comparators 104, 106, these comparators 104, 106 will generate an equivalent output when the difference between the input IN1 and the input IN2 is more than the relative input offset. When the difference between the input IN1 and the input IN2 is less than the difference in input offset between the comparators 104, 106, the accuracy of the comparators 104, 106 may not suffice to consistently provide a correct output. Accordingly, the logic circuit 108 sets the comparator output COUT equal to the output C OUT of the comparator 102. Because the comparator 102 has a longer propagation delay than the comparators 104, 106, setting the comparator output COUT equal to the output C1OUT may also include waiting for the comparator 102 to complete its comparison. The resulting delay may be acceptable, for example, to benefit from the relatively higher accuracy of the comparator 102 when the difference between the inputs IN1 and IN2 is small.

When the difference between the input IN1 and the input IN2 is greater than the difference in input offset between the comparators 104, 106, the accuracy of the comparators 104, 106 may be sufficient to consistently provide a correct output. Accordingly, the logic circuit 108 sets the comparator output COUT equal to the common logic value of the C2OUT and C3OUT. Because the propagation delay of the comparators 104, 106 is less than the propagation delay of the comparator 102, the output COUT may be set before the comparator 102 has completed its comparison. In some examples, the logic circuit 108 also resets one or more of the comparators 102, 104, 106 as described herein to prepare for a next set of inputs IN1, IN2.

In the example of FIG. 1, the logic circuit 108 also provides an optional comparator reset signal CRESET to the comparator 102 to reset the comparator 102. Because the comparator 102 may have a longer propagation delay that the comparators 104, 106, the comparators 104, 106 may complete their comparison first. Accordingly, if the outputs of the comparators 104, 106 are the equivalent, the logic circuit 108 may set the comparator output COUT equal to the common logic value of C2OUT and C3OUT before the comparator 102 completes its comparison of IN1 and IN2. In some examples, when the logic circuit 108 sets the comparator output COUT equal to the common logic value of C2OUT and C3OUT, it also asserts the comparator reset signal CRESET. This may reset all or part of the comparator 102 to configure the comparator 102 to begin the next comparison.

Figure 2:
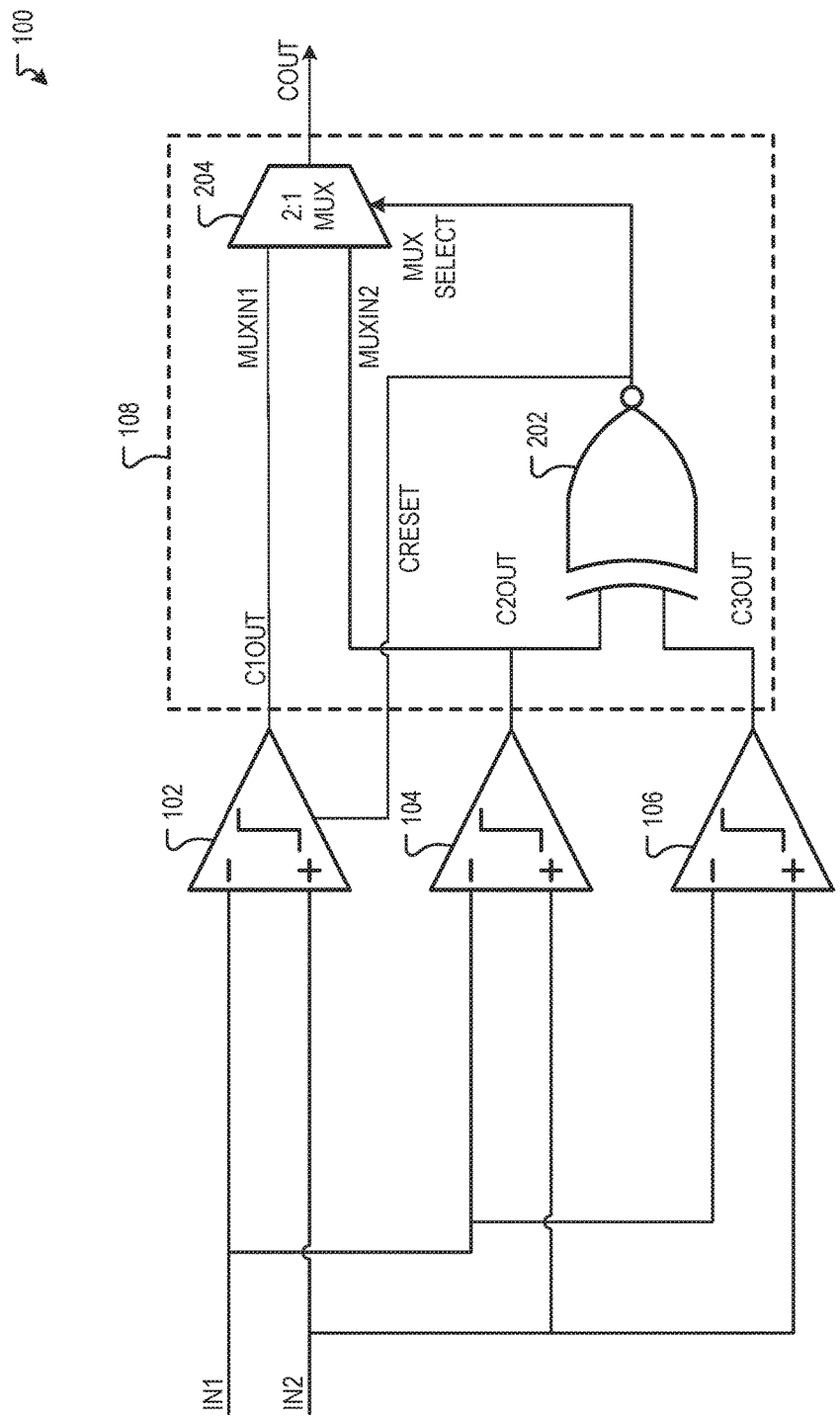
FIG. 2 is a diagram showing another example of the comparator circuit of FIG. 1 including an example implementation of the logic circuit.

FIG. 2 is a diagram showing another example of the comparator circuit 100 of FIG. 1 including an example implementation of the logic circuit 108. In the example of FIG. 2, the logic circuit 108 includes an exclusive NOR (XNOR) circuit 202 and a multiplexer 204. The multiplexer 204 receives the output C OUT of the first comparator 102 at a first input MUXIN1 and the output of the comparator 104 at a second input MUXIN2. In the example of FIG. 2, the output of the comparator 104 is provided to the second input of the multiplexer MUXIN2. In other example arrangements, however, the output of the comparator 106 may be provided to the second input MUXIN2.

Figure 3:
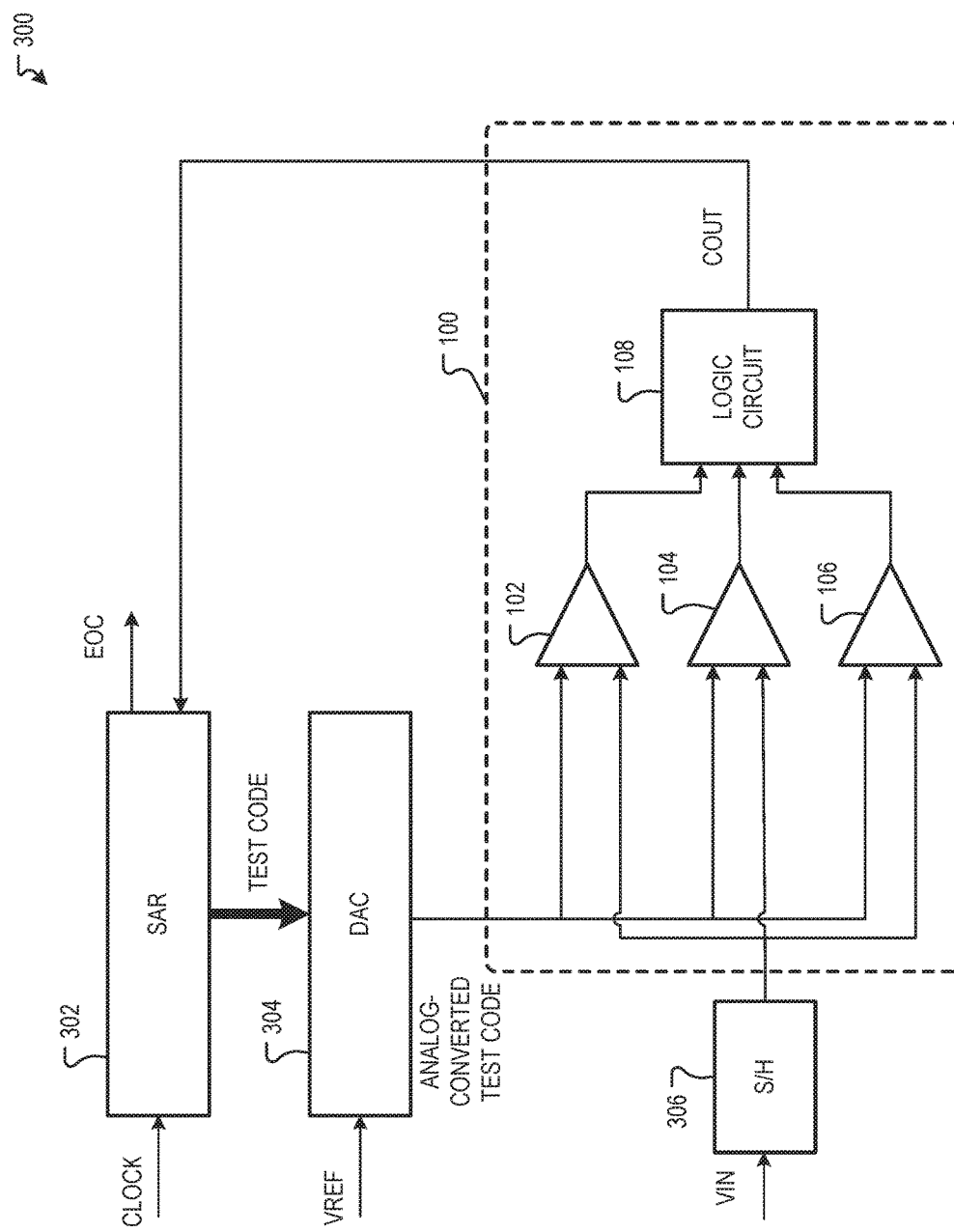
FIG. 3 is a diagram of a Successive Approximation Register (SAR) Analog-to-Digital Converter (ADC) that utilizes one example of a comparator circuit of FIG. 1.

The XNOR circuit 202 receives the outputs C2OUT, C3OUT of the comparators 104 and 106 and generates an output. The output of the XNOR circuit 202 has one logic value when the outputs C1OUT and C2OUT are the same and a different logic value when the outputs C OUT and C2OUT are different. The output of the circuit 202 is provided to a select input MUX SELECT of the multiplexer 204. The multiplexer 204 is configured to provide the output COUT of the comparator circuit 100. When the input MUX SELECT has a logic value indicating that the outputs of the comparators 104, 106 are the same, the multiplexer 204 is configured to provide the second input MUXIN2 as COUT. When the input MUX SELECT has a logic value indicating that the outputs of the comparators are different, the multiplexer 204 is configured to provide the first input MUXIN1 as COUT. Optionally, the output of the XNOR circuit 202 is also used, directly or indirectly, to generate the CRESET signal that is provided to a reset input of the comparator 102. It will be appreciated that the arrangement of the logic circuit 108 is just one example way that FIG. 3 is a diagram of one example of a SAR ADC 300 that utilizes the comparator circuit 100 of FIG. 1. In addition to the comparator circuit 100, the SAR ADC 300 includes a SAR 302, a DAC 304, and a sample and hold (S/H) circuit 306. The SAR ADC 300 receives an analog input voltage VIN and a direct current (DC) reference voltage VREF. The SAR 302 may also receive a digital clock signal CLOCK. The SAR ADC 300 generates a digital equivalent of the input voltage by performing a series of bit trials. In a bit trial, the SAR 302 generates a digital test code. The DAC 304 converts the digital test code to an analog-converted test code. Meanwhile, the analog input voltage VIN is provided to the S/H circuit 306. The S/H circuit 306 may include a capacitor to sample the analog input voltage VIN and hold the analog input voltage VIN. In some examples, DAC and S/H functionality is performed by same set of capacitors.

The comparator circuit 100 compares the analog input voltage VIN to the analog-converted test code and generates the converter output COUT. The logic value of the converter output COUT indicates whether the analog-converted test code is higher or lower than the input voltage VIN. Based on the comparator output COUT, the SAR 302 selects a next test code for the next bit trial. When bit trials have been performed for all bits, the test code used for the final bit trial is used to generate the output of the SAR ADC 300. For example, if the final test code may be the output of the SAR ADC 300 or the final test code may be incremented or decremented based on the comparator output COUT for the final bit trial. The SAR 302 may be configured to generate an end-of-conversion (EOC) signal indicating that the conversion is complete and that the test code on the SAR 302 is the output of the SAR ADC 300.

Figure 4:
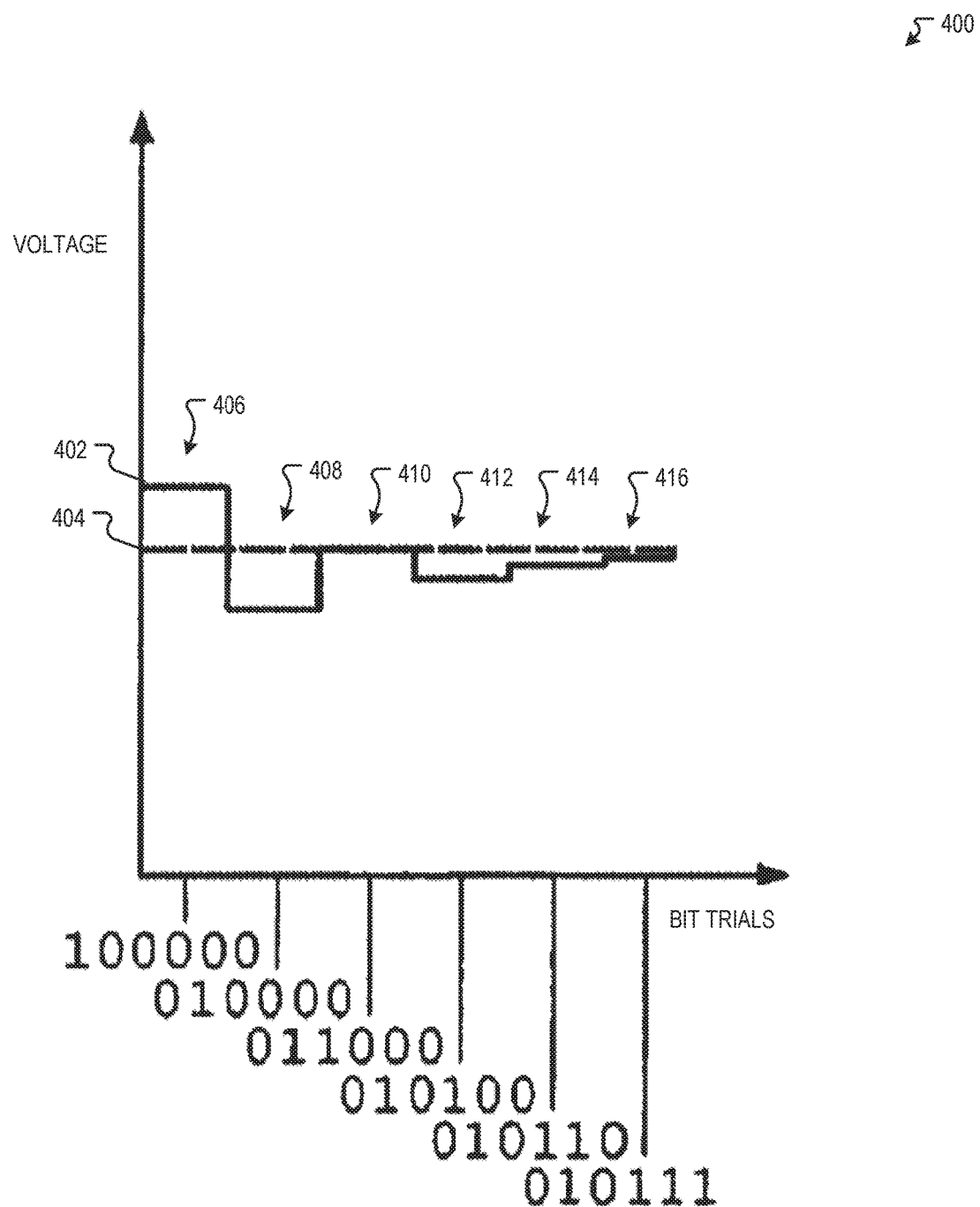
FIG. 4 is a plot illustrating a conversion performed using the SAR ADC of FIG. 3.

FIG. 4 is a plot 400 illustrating a conversion performed using the SAR ADC 300 of FIG. 3. In the plot 400, the horizontal axis shows bit trials 406, 408, 410, 412, 414, 416. The test codes generated by the SAR 302 for the various bit trials 406, 408, 410, 412, 414, 416 are also shown below the horizontal axis. The vertical axis of the plot 400 shows voltage. Two curves are shown on the plot 400. An analog-converted test code 402 indicates the analog-converted test codes for the various bit trials 406, 408, 410, 412, 414, 416. Input voltage VIN 404 shows the input voltage VIN. Accordingly, the comparator circuit 100 compares the input voltage VIN 404 and the analog-converted test code 402 for each bit trial 406, 408, 410, 412, 414, 416.

In the example of FIG. 4, the SAR ADC 300 is configured for six bit conversions. Accordingly, six bit trials are performed and each of the test codes has six bits. Each bit trial sets one bit of the digital output, with the most significant bit (MSB) set by the first bit trial and the least significant bit (LSB) set by the sixth bit trial.

The first bit trial 406 sets the MSB. The SAR 302 selects the digital value "100000" as the test code. As shown, the analog-converted test code 402 corresponding to the digital value "100000" at bit trial 406 is greater than input voltage VIN 404. As a result, SAR 302 sets the MSB to "0." The SAR 302 sets the next test code for the bit trial 408 to "010000." As shown at bit trial 408, the analog-converted test code 402 corresponding to the digital value "010000" is less than input voltage VIN 404. Accordingly, the SAR 302 sets the tested bit to "1." The SAR 302 sets the next test code for the bit trial 410 to "011000." At bit trial 410, the analog-converted test code 402 corresponding to the digital value "011000" is greater than VIN 404. Accordingly, the SAR 302 sets the tested bit to "0." The SAR 302 sets the next test code for the bit trial 412 to "010100." At bit trial 412, the analog-converted test code 402 corresponding to the digital value "010100" is less than VIN 404. Accordingly, the SAR 302 sets the tested bit to "1." The SAR 302 sets the next text code for the bit trial 412 to "010110." At bit trial 414, the analog-converted test code 402 corresponding to the digital value "010110" is less than VIN 404. Accordingly, the SAR 302 sets the tested bit to "1." The SAR 302 sets the next test code for the bit trial 416 to the digital value "010111." At bit trial 416, the analog-converted test code 402 corresponding to the digital value "010111" is less than VIN 404. Accordingly, the SAR 302 sets the LSB to "1" and the output of the SAR ADC 300 is "010111."

In this example, several bit trials, including 406, 408, and 412 use analog-converted test codes that are far from the input voltage VIN 404. The differences at the bit trials 406, 408, 412, for example, may be larger than the relative input offset of the comparators 104, 106. Accordingly, for these bit trials 406, 408, 412, the comparators 104, 106 return the same logic value. That common logic value may be provided to the SAR 302 as the comparator output COUT. For bit trials 410 and 416, the difference between the analog-converted test code 402 and input voltage VIN 404 is less than the relative input offset of the comparators 104, 106. Accordingly, for these bit trials 410, 416, the comparators 104, 106 return different logic values. The logic circuit 108 sets the comparator output COUT to the output C1OUT of the comparator 102, when the comparator output C1OUT is complete. In this way, the speed of bit trials 406, 408, and 412 may be increased while the comparator accuracy for bit trials 410 and 416 is not compromised.

Figure 5:
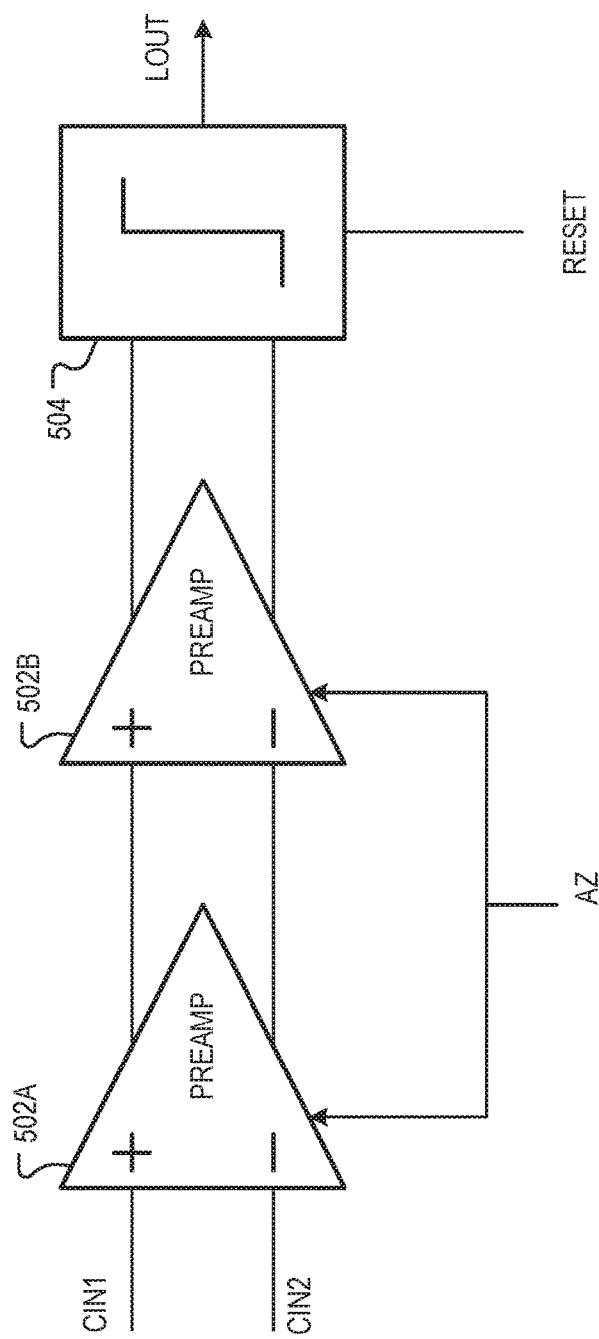
FIG. 5 is a diagram showing one example of a comparator.

FIG. 5 is a diagram showing one example of a comparator 500. The comparator 500 is one example configuration that may be used to implement the comparator 102. In some implementations, the comparator 500 may be used to implement the comparators 104 and/or 106.

The comparator 500 includes two cascaded preamplifier stages 502A, 502B. A first preamplifier stage 502A receives the comparator inputs CIN1 and CIN2. The first preamplifier stage 502A amplifies the inputs CIN1 and CIN2, thereby increasing the difference between them. A second preamplifier stage 502B further amplifies the inputs CIN1, CIN2, which further increases the difference between them. Although two preamplifier stages 502A, 502B are shown in FIG. 5, any suitable number of preamplifier stages may be used. In some examples, the number and/or type of preamplifier stages used affects the accuracy and the propagation delay of the comparator 500. For example, more preamplifier stages can lead to higher accuracy. Accordingly, the comparator 102 may include more preamplifier stages than the comparators 104, 106. (As described herein, in some examples, the comparators 104, 106 do not include any preamplifier stages.)

The comparator 500 also includes a latch 504, which may be a regenerative latch. The latch 504 provides an output LOUT that assumes a first logic value when the preamplified CIN1 is greater than preamplified CIN2 and a second logic value when preamplified CIN1 is less than preamplified CIN2. The latch 504 may also have a reset input RESET. When set, the latch 504 may hold the output OUT until the reset input RESET is asserted.

In some examples, one or more of the preamplifier stages 502A, 502B are auto-zeroing. An auto-zeroing amplifier is configured to reduce or eliminate sources of error, such as offset, drift, etc. Any suitable configuration for auto-zeroing may be used. In some examples, one or more of the preamplifier stages 502A, 502B may include chopper amplifiers that convert the preamplifier output to an alternating current (AC) signal and then reestablish the direct current (DC) output with reduced error. In some examples, one or more of the preamplifier stages 502A, 502B include a main amplifier and a nulling amplifier. In a first phase, the nulling amplifier determines a nulling input. In a second phase, the nulling input is provided to the main amplifier. For example, FIG. 5 shows an auto-zeroing (AZ) input that may be applied to the preamplifier stages 502A, 502B by a nulling amplifier (not shown).

Figure 6:
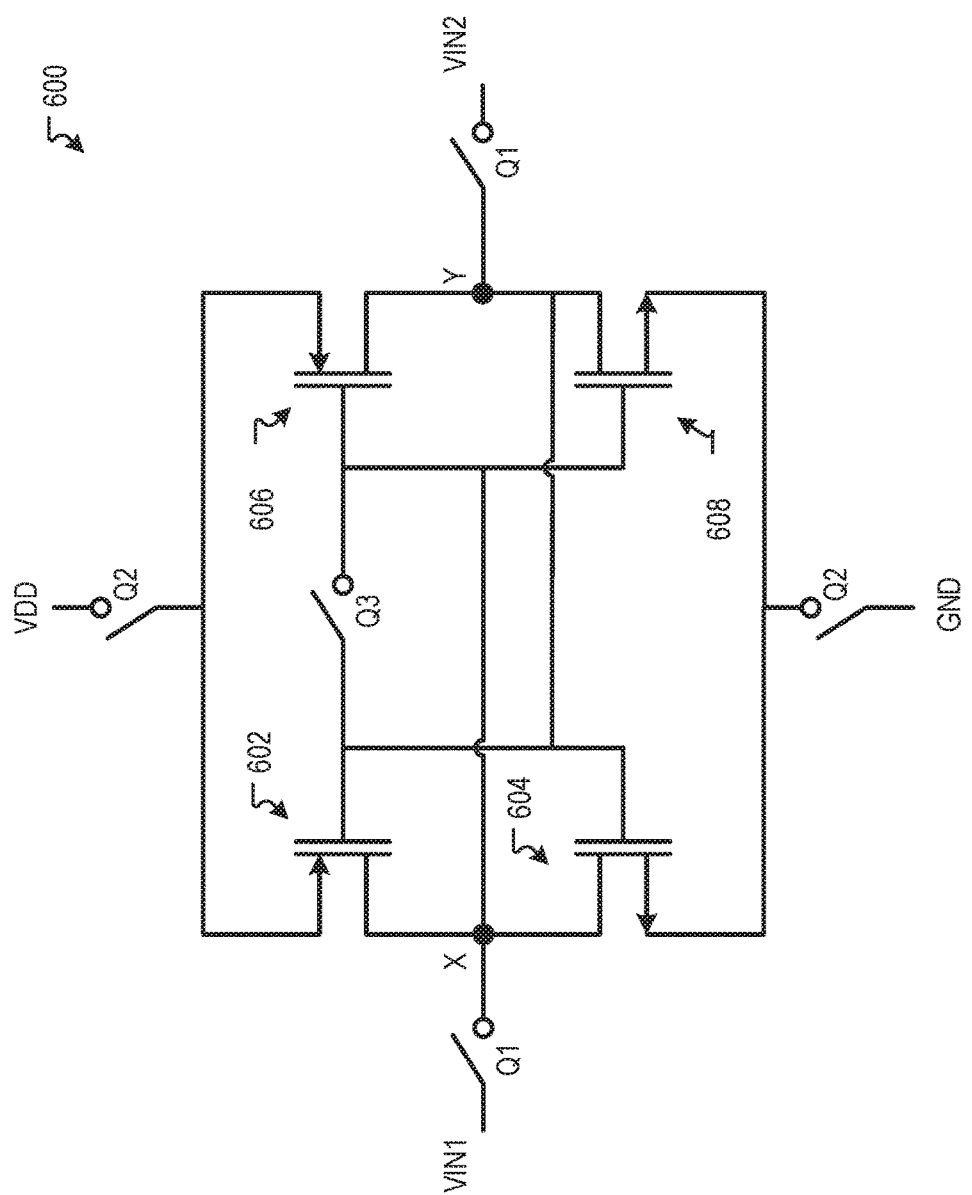
FIG. 6 is a diagram showing one example of a regenerative latch.

FIG. 6 is a diagram showing one example of a regenerative latch 600. The latch 600 may be used, for example, as all or part of one or more of the comparators 102, 104, 106. For example, the latch 600 shows one example way for implementing the regenerative latch 504 of FIG. 5. Generally, the latch 600 may be used in conjunction with one or more preamplifier stages to implement the comparator 102 and/or the comparators 104, 106. Also, in some examples, the latch 600 may be used to implement one or both of the comparators 104, 106 (e.g., without preamplifier stages). The latch 600 illustrates just one way to implement a regenerative latch in the comparator circuits described herein. Other suitable designs may also be used.

The latch 600 includes field effect transistors (FETs) 602, 604, 606, 608. (It will be appreciated that these FETs 602, 604, 606, 608, in some examples, may be substituted for other suitable devices, such as other types of transistors, other types of switches, etc.) Phase switches Q1, Q2, Q3 of the latch 600 operate according to latch phases. The switches Q1, Q2, Q3 may be implemented by transistors or any other suitable switches components. In a first sampling phase, the switches labeled Q1 are closed. Input voltages VIN1 and VIN2 are sampled at the parasitic capacitances of nodes X and Y, respectively. During a second regeneration phase, the switches labeled Q1 are opened and the switches labeled Q2 are closed. FETs 602, 604, 606, and 608 act as a regenerative amplifier, regenerating the sampled difference between VIN1 and VIN2 to the voltage rails VDD and GND. In a third, reset phase, the switch Q3 closes in response to a reset signal. The outputs are, accordingly, which removes any memory of the previous comparison and prepares the latch 600 for a next sampling phase. For example, when a comparator including the latch 600 is reset, a reset signal may be applied to close the switch Q3. As described herein, this removes the memory of the previous comparison performed by the latch 600 and restarts the phase cycle.

Figure 7:
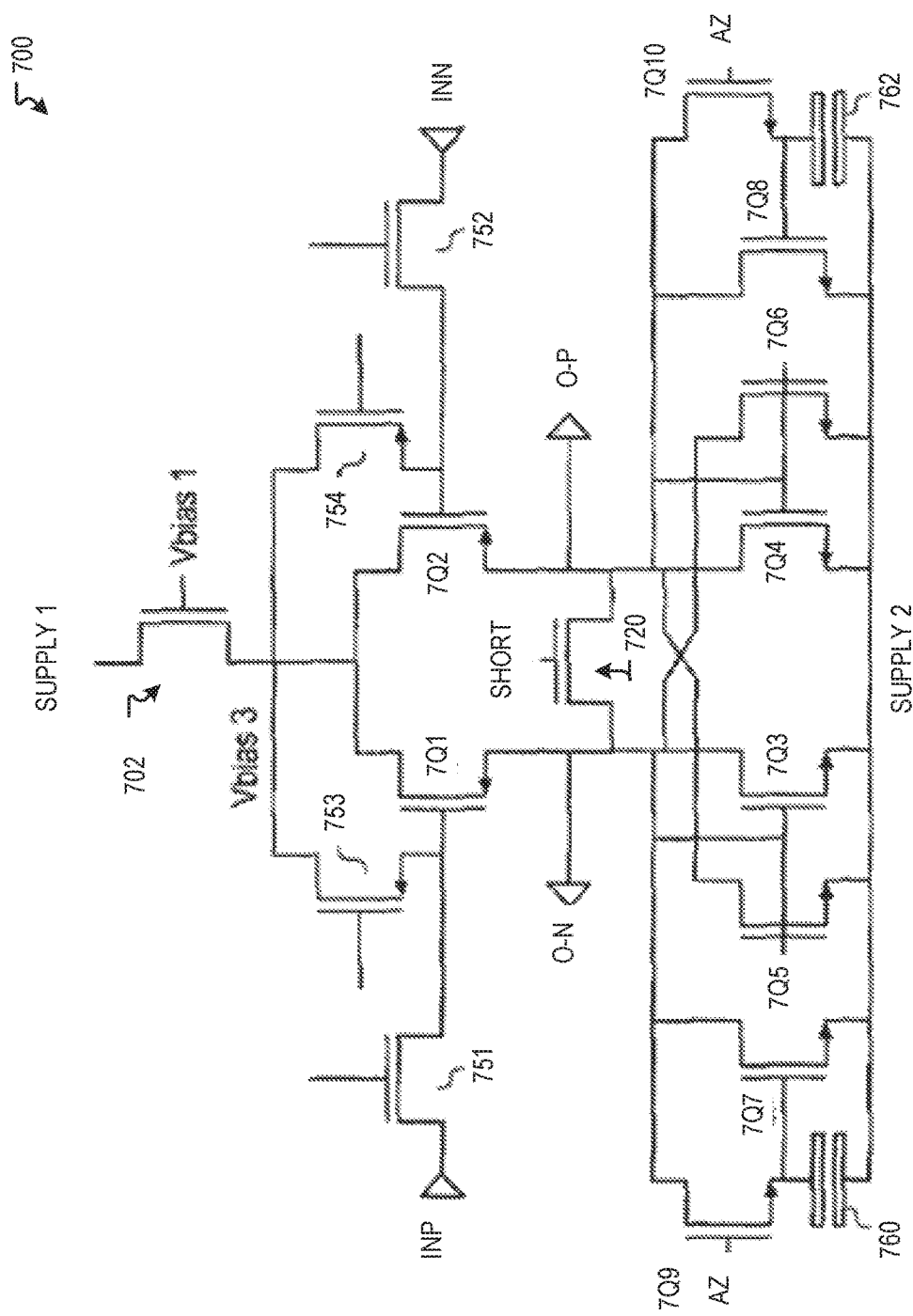
FIG. 7 is a diagram showing one example of an amplifier with auto-zeroing.

FIG. 7 is a diagram showing one example of an amplifier 700 with auto-zeroing. For example, the amplifier 700 may be used to implement one or more of the preamplifier stages 502A, 502B of FIG. 5. The amplifier 700 includes various FETs 7Q1, 7Q2, 7Q3, 7Q4, 7Q5, 7Q6, 7Q7, 7Q8. It will be appreciated that these FETs 7Q1, 7Q2, 7Q3, 7Q4, 7Q5, 7Q6, 7Q7, 7Q8, in some examples, may be substituted for other suitable transistors or similar components. Also, the amplifier 700 includes switches 720, 751, 752, 753, 754. These switches 720, 751, 752, 753, 754 are shown in FIG. 7 as FETs, but may be implemented with any other suitable type of transistor or other switch component.

In the example of FIG. 7, FETs 7Q1 and 7Q2 have their drains connected to a current source that may be formed with a FET 702 coupled to a first supply rail SUPPLY 1. An inverting input (INN) and non-inverting input (INP) are provided to an input section comprising switches 751, 752, 753, 754. The sources of the FETs 7Q1 and 7Q2 are electrically coupled to an active current source comprising FETs 7Q3, 7Q4. An additional FET 7Q5 has its drain connected to the drain of the FET 7Q2 and its source connected to a second supply rail SUPPLY 2. The gate of FET 7Q5 is connected to the gate of FET 7Q3. A sixth FET 7Q6 has its gate connected to the gate of FET 7Q4 and its drain connected to the drain of FET 7Q1. The negative output is at the source of the FET 7Q1 and the positive output is at the source of the FET 7Q2. A negative output (O-N) is taken at the source of FET 7Q1 and a positive output (O-P) is taken at the source of the FET 7Q2. A short switch 720, which may comprise a FET or other suitable transistor, can be closed to short the negative and positive outputs to discharge parasitic capacitance, permitting the amplifier 700 to settle sooner than it otherwise would.

An auto-zeroing input section of the amplifier 700 includes switches 751, 752, 753, 754. Switches 751 and 752 may be used to selectively connect and isolate gates of FETs 7Q1 and 7Q2 from the inverting and non-inverting inputs of the amplifier 700. Thus, when an auto-zero operation is performed, the switches 751 and 752 may be opened. Once the switches 751, 752 are open, switches 753, 754 are switched to a conducting state such that a bias voltage (Vbias3) is applied to the gates of FETS 7Q1 and 7Q2.

A FET 7Q7 has a drain connected to the output node of the negative output and its source connected to the second supply rail SUPPLY 2. If FET 7Q7 is switched into a diode connecting state, then the gain of the amplifier 700 is the transconductance of 7Q7 over the transconductance of 7Q1. If the transconductance of FETs 7Q1 and 7Q7 are similar, then the gain of the amplifier 700 falls to unity when FET 7Q7 is conducting in a diode-connected manner. This may be achieved by using another FET 7Q9 to provide a low impedance path between the drain and the gate of FET 7Q7 during an auto-zero phase. A capacitor 760 may be provided to sample and store the gate voltage of FET 7Q7, depending on whether the FET 7Q9 is in a conducting state (sample) or non-conducting (store). A corresponding arrangement including FETs 7Q8, 7Q10, and capacitor 762 is formed on the other half of the circuit.

In order to understand the operation of the circuit, suppose that switches 751 and 752 are placed in a high impedance state and that switches 753 and 754 are switched to a low impedance state such that the same voltage is applied to the gates of 7Q1 and 7Q2. If the circuit was perfectly matched then the voltages at the negative output and the positive output would be identical. However suppose that there is a slight offset between FETs 7Q1 and 7Q2, and that this offset is represented by Vow. When FETs 7Q9 and 7Q10 are non-conducting, then the load for FETs 7Q1 and 7Q2 is formed solely by FETs 7Q3, 7Q4, 7Q5 and 7Q6 and hence the gain of the stage is large and theoretically approaching infinity. For convenience, it is easier to assume that the gain is finite but large. Therefore suppose that the gain of the circuit is 1000. Therefore the output offset voltage VOUT-$_{OFF}$ would be 1000V$_{OFF}$. However, suppose now that FETs 7Q9 and 7Q10 are operated as switches thereby causing the FETs 7Q7 and 7Q8 to become the predominant load for FETs 7Q1 and 7Q2 thereby reducing the gain of the circuit to close to unity. If we assume for convenience that the gain is reduced to unity then the output offset VOUT$_{OFF}$ becomes reduced to that of the input offset Von. The capacitors 760 and 762 charge to the gate voltages of FETs 7Q7 and 7Q8 in order to achieve this condition. Suppose now that FETs 7Q9 and 7Q10 are switched into a non-conducting state. The output voltage offset immediately subsequent to switching of FETs 7Q9 and 7Q10 off is identical to that which occurred immediately prior to switching the transistors off, but the gain of the circuit increased from around unity to around 1000 times. It can therefore be seen that the input referenced offset has effectively been reduced by a factor of 1000 as FETs 7Q7 and 7Q8 become driven by a constant gate voltage and therefore effectively form an infinite impedance load.

FIGS. 6 and 7 provide examples of regenerative latches and preamplifier stages that may be used in various examples. It will be appreciated that other suitable examples of latches and/or preamplifiers may be used to implement the comparators 102, 104, 106 described herein.

Figure 8:
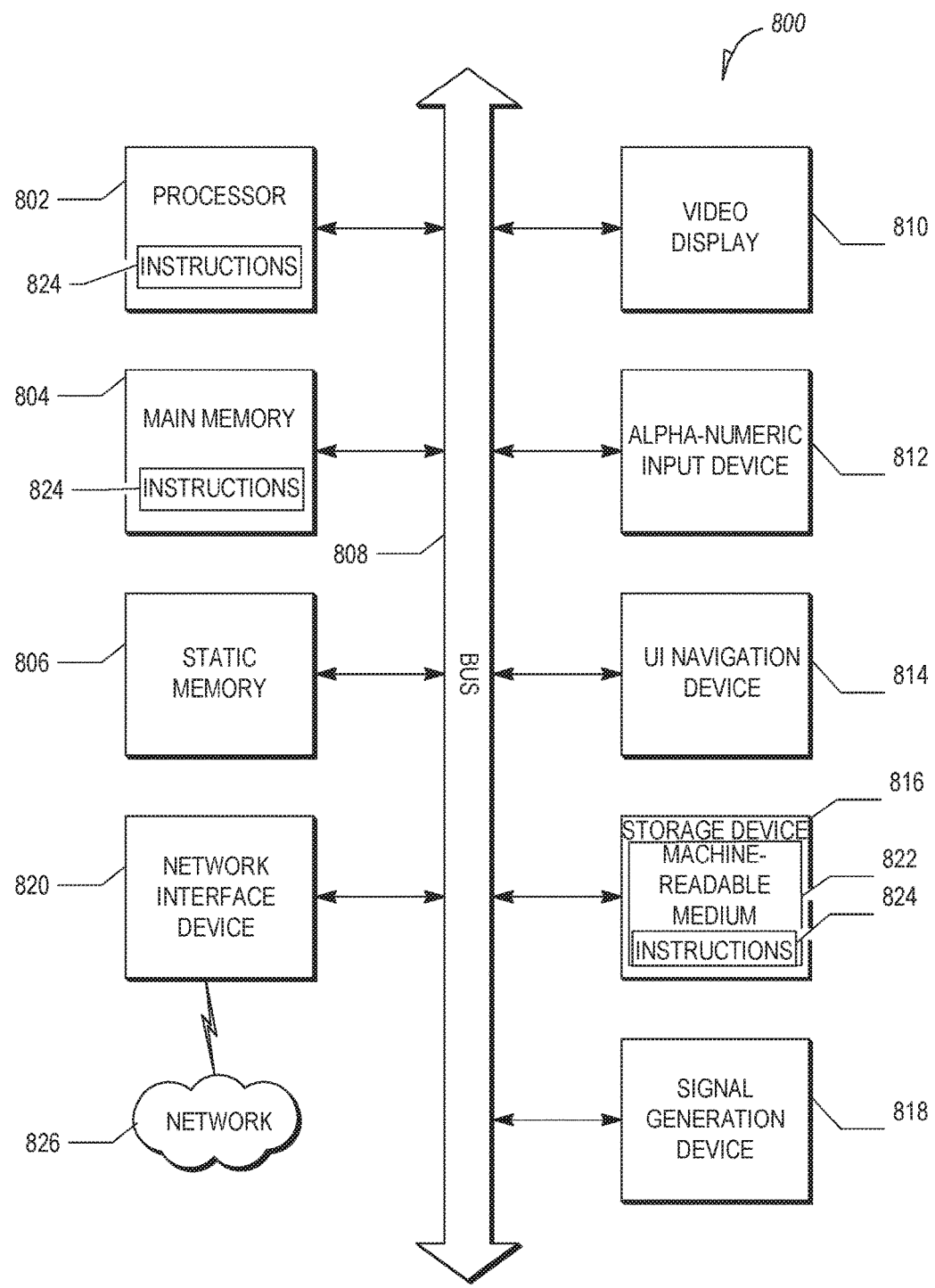
FIG. 8 is a block diagram illustrating a computing device hardware architecture within which a set or sequence of instructions can be executed to cause a machine to perform examples of any one of the methodologies discussed herein.

FIG. 8 is a block diagram illustrating a computing device hardware architecture 800, within which a set or sequence of instructions can be executed to cause a machine to perform examples of any one of the methodologies discussed herein. In some examples, the architecture 800 is used to implement the logic circuit of the comparator circuit described herein, and/or used in conjunction with the comparator circuit described herein.

The architecture 800 may operate as a standalone device or may be connected (e.g., networked) to other machines. In a networked deployment, the architecture 800 may operate in the capacity of either a server or a client machine in server-client network environments, or it may act as a peer machine in peer-to-peer (or distributed) network environments. The architecture 800 can be implemented in a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 800 includes a processor unit 802 comprising at least one processor (e.g., a central processing unit (CPU), a graphics processing unit (GPU), or both, processor cores, compute nodes, etc.). The architecture 800 may further comprise a main memory 804 and a static memory 806, which communicate with each other via a link 808 (e.g., bus). The architecture 800 can further include a video display unit 810, an alphanumeric input device 812 (e.g., a keyboard), and a UI navigation device 814 (e.g., a mouse). In some examples, the video display unit 810, alphanumeric input device 812, and UI navigation device 814 are incorporated into a touchscreen display. The architecture 800 may additionally include a storage device 816 (e.g., a drive unit), a signal generation device 818 (e.g., a speaker), a network interface device 820, and one or more sensors (not shown), such as a GPS sensor, compass, accelerometer, or other sensor.

In some examples, the processor unit 802 or another suitable hardware component may support a hardware interrupt. In response to a hardware interrupt, the processor unit 802 may pause its processing and execute an ISR, for example, as described herein.

The storage device 816 includes a machine-readable medium 822 on which is stored one or more sets of data structures and instructions 824 (e.g., software) embodying or utilized by any one or more of the methodologies or functions described herein. The instructions 824 can also reside, completely or at least partially, within the main memory 804, within the static memory 806, and/or within the processor unit 802 during execution thereof by the architecture 800, with the main memory 804, the static memory 806, and the processor unit 802 also constituting machine-readable media. The instructions 824 stored at the machine-readable medium 822 may include, for example, instructions for implementing a software architecture, instructions for executing any of the features described herein, etc.

While the machine-readable medium 822 is illustrated in an example to be a single medium, the term "machine-readable medium" can include a single medium or multiple media (e.g., a centralized or distributed database, and/or associated caches and servers) that store the one or more instructions 824. The term "machine-readable medium" shall also be taken to include any tangible medium that is capable of storing, encoding, or carrying instructions for execution by the machine and that cause the machine to perform any one or more of the methodologies of the present disclosure, or that is capable of storing, encoding, or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM) and electrically erasable programmable read-only memory (EEPROM)) and flash memory devices; magnetic disks such as internal hard disks and removable disks; magneto-optical disks; and CD-ROM and DVD-ROM disks.

The instructions 824 can further be transmitted or received over a communications network 826 using a transmission medium via the network interface device 820 utilizing any one of a number of well-known transfer protocols (e.g., hypertext transfer protocol (HTTP)). Examples of communication networks include a LAN, a WAN, the Internet, mobile telephone networks, plain old telephone service (POTS) networks, and wireless data networks (e.g., Wi-Fi, 3G, and 5G LTE/LTE-A or WiMAX networks). The term "transmission medium" shall be taken to include any intangible medium that is capable of storing, encoding, or carrying instructions for execution by the machine, and includes digital or analog communications signals or other intangible media to facilitate communication of such software.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE)

802.11 family of standards known as Wi-Fi®), IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A variable speed comparator circuit, comprising:
   a first comparator configured to generate a first comparator output using a first input and a second input;
   a second comparator configured to generate a second comparator output using the first input and the second input, wherein a propagation delay of the second comparator is less than a propagation delay of the first comparator;
   a third comparator configured to perform operations comprising generating a third comparator output using the first input and the second input, wherein a propagation delay of the third comparator is less than a propagation delay of the first comparator, and wherein the second comparator has an input offset relative to the third comparator; and
   a logic circuit configured to perform operations comprising:
      determining that the second comparator output and the third comparator output are not equivalent; and
      setting a comparator circuit output to the first comparator output.

2. The comparator circuit of claim 1, wherein the logic circuit is further configured to perform operations comprising:
   determining that the second comparator output and the third comparator output have a common logic value; and
   setting the comparator circuit output to the common logic value.

3. The comparator circuit of claim 2, wherein the logic circuit is further configured to perform operations comprising resetting the first comparator in response to determining that the second comparator output and the third comparator output have the common logic value.

4. The comparator circuit of claim 1, wherein the second comparator has a positive input offset, and wherein the third comparator has a negative input offset.

5. The comparator circuit of claim 1, wherein the first comparator is an auto-zero comparator.

6. The comparator circuit of claim 1, wherein the second comparator comprises a latch, the latch comprising a first input connected to receive the first input and a second input connected to receive the second input.

7. The comparator circuit of claim 1, wherein the logic circuit comprises:
   an exclusive NOR (XNOR) circuit configured to perform operations comprising generating an XNOR output using the second comparator output and the third comparator output; and
   a multiplexer comprising a first input connected to receive the first comparator output, a second input connected to receive the second comparator output, and a select input connected to receive the XNOR output.

8. The comparator circuit of claim 1, wherein the first comparator comprises a first set of preamplifiers and a first regenerative latch, wherein the second comparator comprises a second set of preamplifiers and a second regenerative latch, and wherein the second set of preamplifiers includes fewer preamplifiers than the first set of preamplifiers.

9. The comparator circuit of claim 1, further comprising;
   a successive approximation register (SAR) configured to generate a set of digital test codes; and
   a digital-to-analog converter (DAC) configured to generate a first analog-converted test code from a first digital test code of the set of digital test codes, wherein the first analog-converted test code is provided to the first input and an input signal is provided to the second input.

10. A method for comparing a first input and a second input with a comparator circuit, comprising:
   generating a first comparator output with a first comparator of the comparator circuit;
   generating a second comparator output with a second comparator of the comparator circuit, wherein a propagation delay of the second comparator is less than a propagation delay of the first comparator;

generating a third comparator output with a third comparator of the comparator circuit, wherein a propagation delay of the third comparator is less than a propagation delay of the first comparator, and wherein the second comparator has an input offset relative to the third comparator;

determining that the second comparator output and the third comparator output are not equivalent; and setting an output of the comparator circuit to the first comparator output.

11. The method of claim 10, further comprising:

determining that the second comparator output and the third comparator output have a common logic value; and setting the comparator circuit output to the common logic value.

12. The method of claim 11, further comprising resetting the first comparator in response to determining that the second comparator output and the third comparator output have the common logic value.

13. The method of claim 10, further comprising;

generating a set of digital test coded with a successive approximation register (SAR); and generating, with a digital-to-analog converter (DAC), a first analog-converted test code from a first digital test code of the set of digital test codes, wherein the first analog-converted test code is provided to the first input and an input signal is provided to the second input.

14. A variable speed comparator circuit, comprising:

means for generating a first comparator output using a first input and a second input;

means for generating a second a second comparator output using the first input and the second input, wherein a propagation delay for generating the second comparator output is less than a propagation delay for generating the first comparator output;

means for generating a third comparator output using the first input and the second input, wherein a propagation delay for generating the second comparator output is less than a propagation delay for generating the first comparator output, and wherein the means for generating the second comparator output has an input offset relative to the means for generating the third comparator output; and means for determining that the second comparator output and the third comparator output are not equivalent; and means for setting a comparator circuit output to the first comparator output.

15. The comparator circuit of claim 14, further comprising:

means for determining that the second comparator output and the third comparator output have a common logic value; and means for setting the comparator circuit output to the common logic value.

16. The comparator circuit of claim 15, further comprising means for resetting the first comparator in response to determining that the second comparator output and the third comparator output have the common logic value.

17. The comparator circuit of claim 14, wherein the means for determining that the second comparator output and the third comparator output are not equivalent comprise an exclusive NOR (XNOR) circuit.

18. The comparator circuit of claim 17, wherein the means for setting the comparator circuit output to the first comparator output comprise a multiplexer comprising a first input connected to receive the first comparator output, a second input connected to receive the second comparator output, and a select input connected to receive an output of the XNOR circuit.

19. The comparator circuit of claim 14, wherein the means for generating the first comparator output comprises a first set of preamplifiers and a first regenerative latch, wherein the means for generating second comparator output comprises a second set of preamplifiers and a second regenerative latch, and wherein the second set of preamplifiers includes fewer preamplifiers than the first set of preamplifiers.

20. The comparator circuit of claim 14, further comprising;

means for generating a set of digital test codes; and means for generating a first analog-converted test code from a first digital test code of the set of digital test codes, wherein the first analog-converted test code is provided to the first input and an input signal is provided to the second input.

* * * * *